United States Patent
Yamauchi

(10) Patent No.: US 9,825,427 B2
(45) Date of Patent: Nov. 21, 2017

(54) OPTICAL MODULE INSTALLING A SEMICONDUCTOR OPTICAL AMPLIFIER

(71) Applicant: Sumitomo Electric Device Innovations, Inc., Yokohama-shi (JP)

(72) Inventor: Yasuyuki Yamauchi, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 15/462,595

(22) Filed: Mar. 17, 2017

(65) Prior Publication Data

US 2017/0194762 A1 Jul. 6, 2017

Related U.S. Application Data

(62) Division of application No. 14/794,387, filed on Jul. 8, 2015, now Pat. No. 9,634,463.

(30) Foreign Application Priority Data

Jul. 9, 2014 (JP) .................................. 2014-141632
Jul. 9, 2014 (JP) .................................. 2014-141635

(51) Int. Cl.
*H01S 5/022* (2006.01)
*H01S 5/024* (2006.01)
*H01S 5/50* (2006.01)
*G02B 6/32* (2006.01)
*G02B 6/42* (2006.01)
*H01S 5/343* (2006.01)

(52) U.S. Cl.
CPC ............ *H01S 5/02284* (2013.01); *G02B 6/32* (2013.01); *G02B 6/4208* (2013.01); *G02B 6/4237* (2013.01); *G02B 6/4238* (2013.01); *G02B 6/4244* (2013.01); *H01S 5/02216* (2013.01); *H01S 5/02248* (2013.01); *H01S 5/02438* (2013.01); *H01S 5/3434* (2013.01); *H01S 5/50* (2013.01)

(58) Field of Classification Search
CPC ............ H01S 5/02284; H01S 5/02288; H01S 5/02216; H01S 5/02438; G02B 6/4237; G02B 6/4238
See application file for complete search history.

(56) References Cited

U.S. PATENT DOCUMENTS 4,752,109 A * 6/1988 Gordon ................ G02B 6/4204
257/712
2002/0131699 A1 9/2002 Raguin et al.
(Continued)

FOREIGN PATENT DOCUMENTS

JP 6-232814 A 8/1994
JP 2012-118293 A 6/2012

*Primary Examiner* — Eric Bolda
(74) *Attorney, Agent, or Firm* — Venable LLP; Michael A. Sartori; Laura G. Remus

(57) ABSTRACT

An optical module providing a semiconductor optical amplifier (SOA), and a process to assembly the optical module are disclosed. The optical module provides front and rear coupling units each optically coupled with the SOA and fixed to the housing enclosing the SOA. The housing has a slim wall fixing a lens holder soldered to the slim wall. The front and/or rear coupling unit is fixed to the lens holder by YAG laser welding after the active alignment by using a spontaneous emission of the SOA, and amplified emission of externally provided test beam.

5 Claims, 18 Drawing Sheets

(56) References Cited

U.S. PATENT DOCUMENTS

| | | |
|---|---|---|
| 2003/0099033 A1 | 5/2003 | Magari et al. |
| 2004/0165838 A1 | 8/2004 | Pliska et al. |
| 2004/0264888 A1 | 12/2004 | Go |
| 2009/0232173 A1 | 9/2009 | Nakagawa |
| 2010/0111468 A1 | 5/2010 | Funabashi et al. |
| 2011/0167656 A1* | 7/2011 | Huang .................. H01S 5/005 33/286 |
| 2011/0243494 A1 | 10/2011 | Hasegawa et al. |

* cited by examiner

OPTICAL MODULE INSTALLING A SEMICONDUCTOR OPTICAL AMPLIFIER

CROSS REFERENCE TO RELATED APPLICATIONS

This application is a Divisional of U.S. patent application Ser. No. 14/794,387, filed Jul. 8, 2015, which claims the benefit of Japanese Patent Application No. 2014-141632, filed Jul. 9, 2014 and Japanese Patent Application No. 2014-141635, filed Jul. 9, 2014.

BACKGROUND OF THE INVENTION

1. Field of the Invention

The present invention relates to an optical module and a process to assemble the same. In particular, the present invention relates to an optical module that provides a semiconductor optical amplifier (SOA), and a process to assemble the optical module.

2. Background Arts

An optical module providing an SOA therein has been well known in the field of the optical communication, or the optical component. Such an optical module often installs an optical isolator to prevent light from returning back to the SOA because the returned light causes optical noises. The SOA is necessary to be coupled with other optical devices or components in respective facets thereof opposite to each other. When the optical isolator couples with one of facets of the SOA, the active alignment of the other optical devices/ components sometimes becomes impossible because the optical isolator cuts light coming from the SOA.

Also, when an optical module implementing an SOA assembles other optical components as optically coupling with respective facets of the SOA, simplified processes and arrangements for assembling other components with the SOA are preferable because two facets arrangements sometimes cause failures and easily brings miss-alignment between components. The present invention is to solve those subjects.

SUMMARY OF THE INVENTION

An aspect of the present application relates to a process to assemble an optical module. The optical module of the present application provides an amplifier unit and a coupling unit. the amplifier unit installs a semiconductor optical amplifier (SOA) therein. The coupling unit receives an external optical fiber optically coupled with the SOA. The process of the present application includes steps of: (1) activating the SOA to generate a spontaneous emission therefrom; and (2) aligning the coupling unit with the SOA at a position where the spontaneous emission of the SOA detected through the external optical fiber becomes a maximum or exceeds a preset threshold.

The optical module may further include another coupling unit that provides an optical isolator for cutting light coming from the SOA but passing light going to the SOA. The process of the present application may further provide steps of, after the step of aligning the coupling unit with the SOA, (3) providing a test beam to the SOA through the another coupling unit; and (5) aligning the another coupling unit with the SOA at a position where the test beam amplified by the SOA and detected through the external fiber becomes a maximum or exceeds a preset threshold.

Another aspect of the preset application relates to an arrangement of an optical module. The optical module comprises an amplifier unit, a lens holder, and a coupling unit. The amplifier unit may include a housing that encloses a semiconductor optical amplifier (SOA) therein. The lens holder secures a lens that is optically coupled with the SOA. The lens holder may be fixed to the housing by soldering. The coupling unit receives an optical fiber therein. A feature of the optical module is that the coupling unit is welded to the lens holder but the lens holder is soldered to the housing.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENTS

Next, some embodiments according to the present application will be described as referring to drawings. In the description of the drawings, numerals or symbols same with or similar to each other will refer to elements same with or similar to each other without duplicating explanations.

First Embodiment

Figure 1:
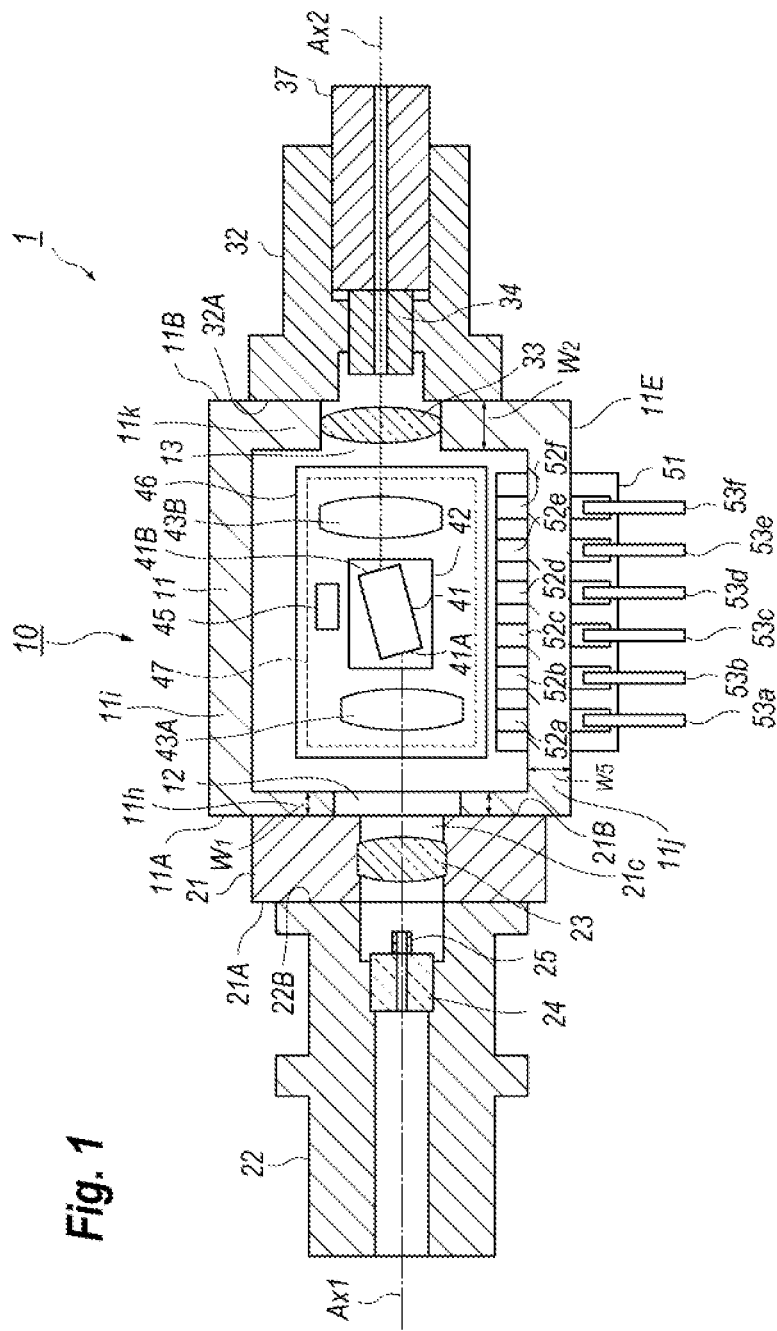
FIG. 1 shows a cross section of an optical module according to the first embodiment of the present application.

FIG. 1 illustrates across section of an optical module 1 assembled by a process according to an embodiment of the present invention. The optical module 1 provides an amplifier unit 10, a front lens holder 21, a front coupling unit 22, and a rear coupling unit 32. In the description below, the direction "front" means a side where the front coupling unit 22 is assembled with respect to the amplifier unit 10, and the other direction "rear" means the side where the rear coupling unit 32 is assembled. However, these directions of the "front" and "rear" are only for the explanation sake and may not affect the scope of the invention. The front lens holder 21 secures a lens 23 which optically couples with the front coupling unit 22 and a semiconductor optical amplifier (SOA) 41 enclosed in the amplifier unit 10. FIG. 1 also illustrates a front optical axis Ax1 connecting the front coupling unit 22 with the SOA 41 and a rear optical axis Ax2 connecting the rear coupling unit 32 also with the SOA 41.

The amplifier unit 10 provides a housing 11 that includes side walls, 11h to 11k. The front wall 11h provides a front surface 11A and a front opening 12. The front lens holder 21 provides a front surface 21A, and a rear surface 21A, where the front surface 21A is fixed to the rear surface 22B of the front coupling unit 22 and the rear surface 21B is fixed to the front surface 11A of the housing 11. The housing 11 may be made of alloy containing iron (Fe), nickel (Ni), and cobalt (Co), which is often called as Kovar. The front lens holder 21 and the front coupling unit 22 may be made of stainless steel and have respective cylindrical shapes.

The housing 11 further provides a rear surface 11B and a rear opening 13 in the rear wall 11k. The rear opening 13 secures a lens 33, which is a concentrating lens in the present embodiment, for coupling the SOA 41 optically with the rear coupling unit 32. The rear coupling unit 32, which may have a cylindrical shape, provides a front surface 32A fixed to the rear surface 11B of the housing 11. The rear coupling unit 32, which may be made of stainless steel, receives an external fiber 37 and provides a stub 34 therein.

The housing 11, in addition to the SOA 41, further encloses a sub-carrier 42, front and rear collimating lenses, 43A and 43B, a thermistor 45, a carrier 36, and a thermo-electric cooler (TEC) 47. The SOA 41 may be made of semiconductor materials involved in a group of InP, which means that lattice constants of such semiconductor materials are substantially equal to or within a range capable of being epitaxially grown on the InP substrate. Specifically, the SOA 41 provides, on the n-type InP substrate, an n-type InP cladding layer, an active layer comprising plurality of well layers made of InGaAsP and a plurality of barrier layers also made of InGaAsP alternately stacked to each other, and a p-type InP cladding layer. The SOA 41, which is assembled between the front and rear collimating lenses, 43A and 43B, has a front facet 41A optically coupled with the front collimating lens 43 and a rear facet 41B coupled with the rear collimating lens 44, where each of the facets, 41A and 41B, is set inclined to respective optical axes, Ax1 and Ax2, to suppress light output from the SOA 41 from returning the SOA 41.

The SOA 41 is mounted on the TEC 47 through the carrier 46 and the sub-carrier 42; while, the collimating lenses, 43A and 43B, and the thermistor 45 are mounted directly on the carrier 46. The TEC 47 may be a type of Peltier devices. The thermistor 45, which may sense a temperature of the SOA 41, is preferably set immediate to the SOA 41.

The housing 11 may further provide an electrical terminal 51 that mounts electrodes, 52a to 52f, and lead pins, 53a to 53b, thereon. The electrodes, 52a to 52f, are electrically connected to the SOA 41, the thermistor 45, and the TEC 47 inside of the housing 11; but, in the outside of the housing, they are electrically connected to respective lead pins, 53a to 53f. Thus, the electrodes, 52a to 52f, pass the side wall 11j. The devices within the housing 11 may be controlled externally through the lead pins, 53a to 53f, and the electrodes, 52a to 52f. The terminal 51 may be made of multi-layered ceramics. The lead pins, 53a to 53f, and the electrodes, 52a to 52f, are made of copper (Cu) based metal plated with gold (Au).

The front coupling unit 22 may be a type of an optical receptacle that pluggably receives an external optical fiber, which is not illustrated in the figures, or a type of a pig-tailed coupling which permanently provides an external optical fiber to be coupled with another optical fiber through an optical connector provided in the outside of the front coupling unit 22. In the receptacle arrangement, the front coupling unit 22 may provide a stub 24 and an optical isolator 25 attached to an end of the stub 24. The stub 24, which may be made of ceramics and provides a coupling fiber in a center thereof, abuts against a ferrule secured in an end of the external optical fiber. Abutting the ferrule with the tip of the external optical fiber against the stub 24, in particular, the tip of the coupling fiber secured in the center of the stub 24, the external optical fiber may be physically in contact with the coupling fiber, which is often called as the physical contact (PC), without causing Fresnel reflection between the external optical fiber and the coupling fiber. Thus, the external optical fiber may realize a stable optical coupling against the lens front 23, or the SOA 41 in the amplifier unit 10. The optical isolator 45 passes light provided from the external optical fiber toward the SOA 41 but cuts the light provided from the SOA 41.

The optical module 1 of the present embodiment shown in FIG. 1 provides the front wall 11h, which has the front surface 11A, having a thickness different from that of the rear wall 11k having the rear surface 11B. Specifically, the thickness of the front wall 11h is smaller than the thickness of the rear wall 11k, also smaller than the thickness of other side walls, 11i and 11j, where the latter side wall 11j provides the terminal 51. The present housing 11 has the thickness $W_1$ in the front wall 11h of, for instance, 0.3 mm and thicknesses, $W_2$ and $W_5$, in the rear wall 11k and the side wall 11j of 1.0 mm, respectively. The front wall 11h preferably has a thickness $W_1$ of 0.1 to 0.3 mm and the rear wall 11k has a thickness $W_2$ of greater than 0.8 mm. A wall with a thickness greater than 0.8 mm may show tolerance against the laser welding.

Figure 2:
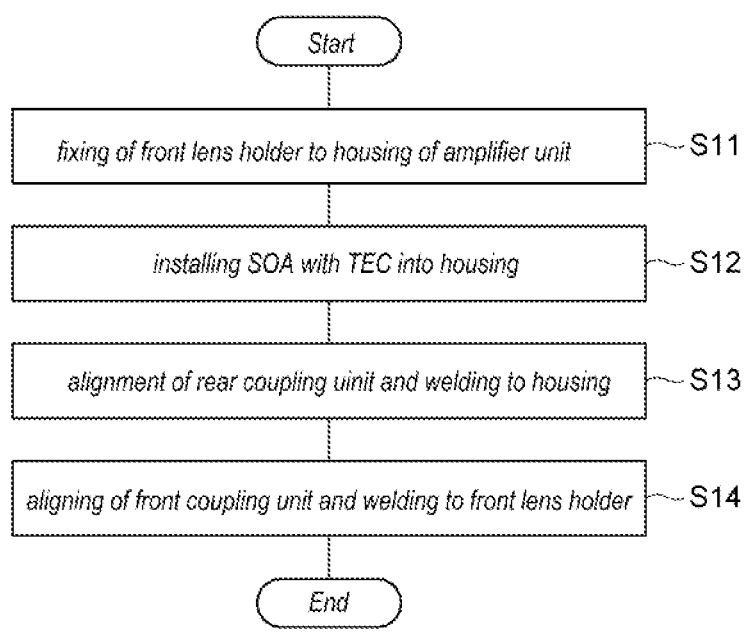
FIG. 2 is a flow chart of a process to assemble the optical module shown in FIG. 1.

FIG. 2 is a flow chart of a process to assemble the optical module 1 shown in FIG. 1. The process comprises steps S11 to S14, and FIGS. 3 to 6 shows respective steps, S11 to S14.

Figure 3:
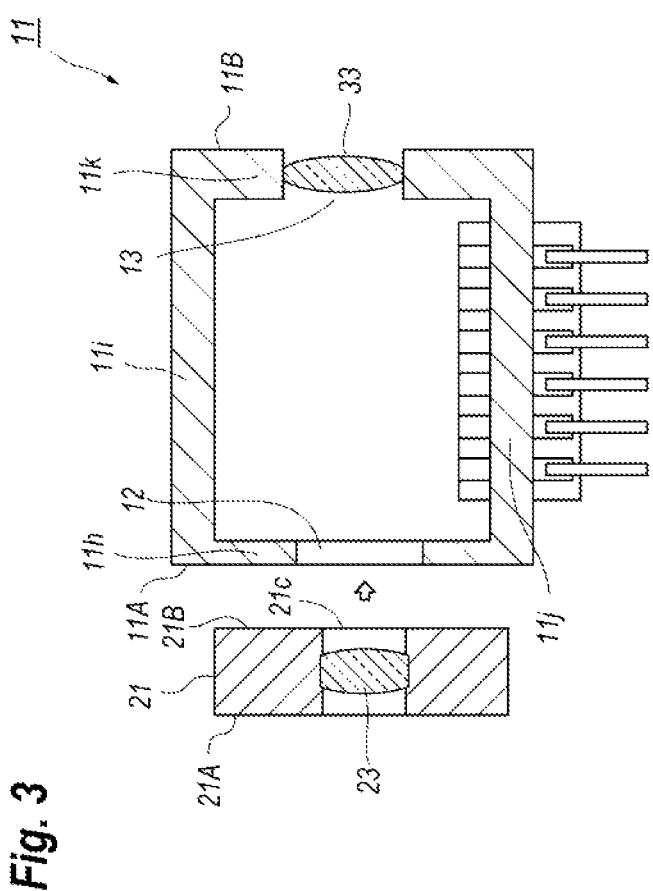
FIG. 3 shows a process to assemble the front lens holder with the housing of the amplifier unit.
Figure 4:
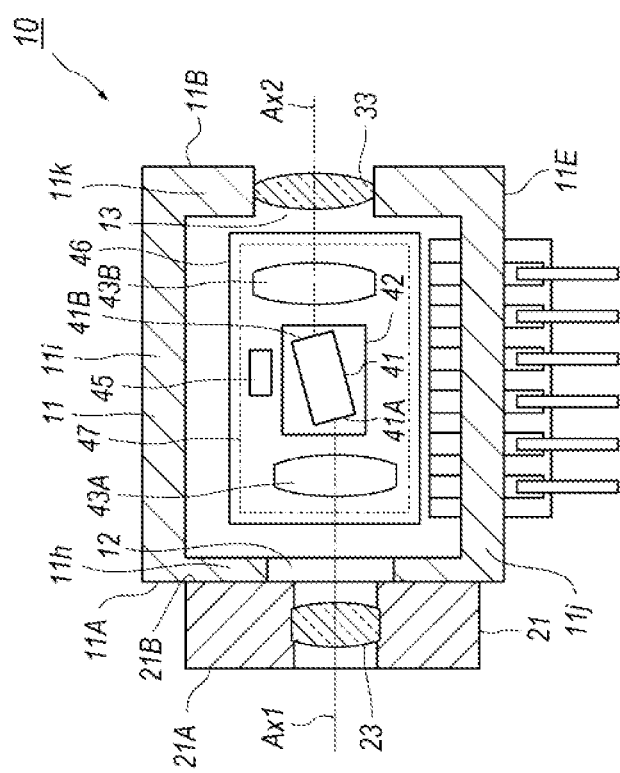
FIG. 4 shows a process to install an intermediate assembly including the SOA, the front and rear collimating lenses, the thermistor, where they are mounted on the thermos-electric cooler, into the housing of the amplifier unit.

As shown in FIG. 3, the process at step S1 according to the present embodiment first assembles the front lens holder 21 with the housing 11, where the housing 11 assembles the terminal 51 in the side wall 11j and the rear opening 13 secures the lens 23 in advance to the assembly of the lens holder 21. The fixing of the front lens holder 21 may be performed by soldering as heating the rear surface 21B of the lens holder 21 by, for instance, the induction heating. The induction heating may melt the solder applied on the rear surface 21B of the lens holder 21, which may fix the lens holder 21 to the front surface 11A of the housing 10.

Next, the process installs the TEC 47 within the housing 11 at step S12, where the TEC 47 mounts the sub-carrier 42 that assembles the SOA 41 thereon, the front and rear collimating lenses, 43A and 43B, and the thermistor 45 through the carrier 46.

Figure 5:
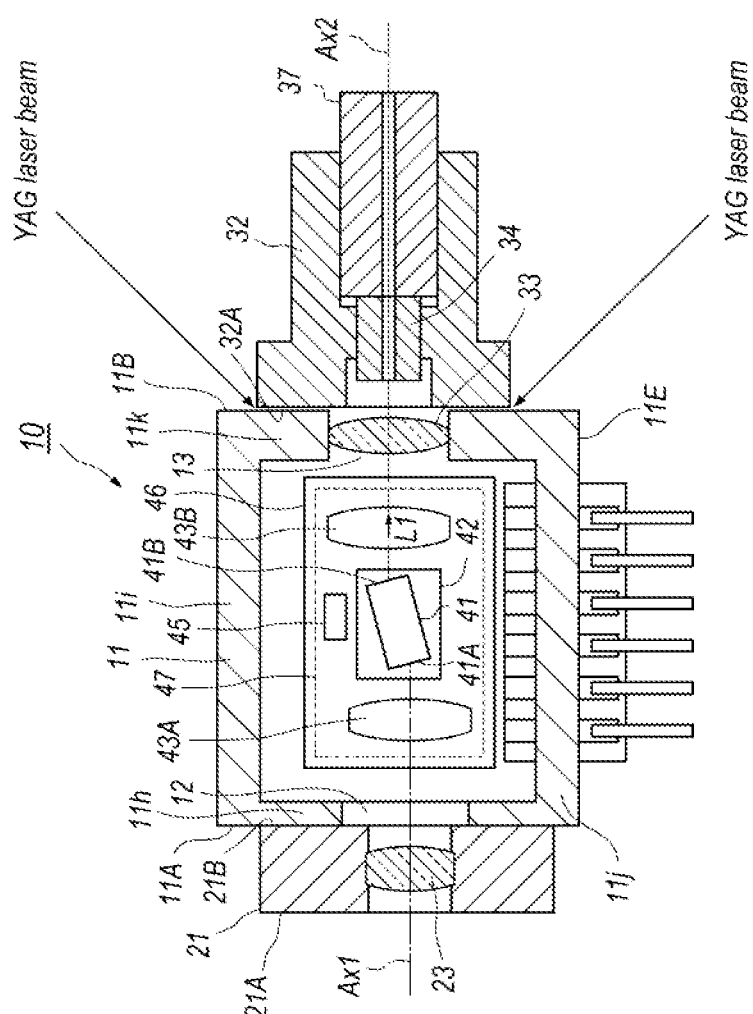
FIG. 5 shows a process to align the rear coupling unit with the SOA and fix the rear coupling unit to the housing by YAG laser beam.
Figure 6:
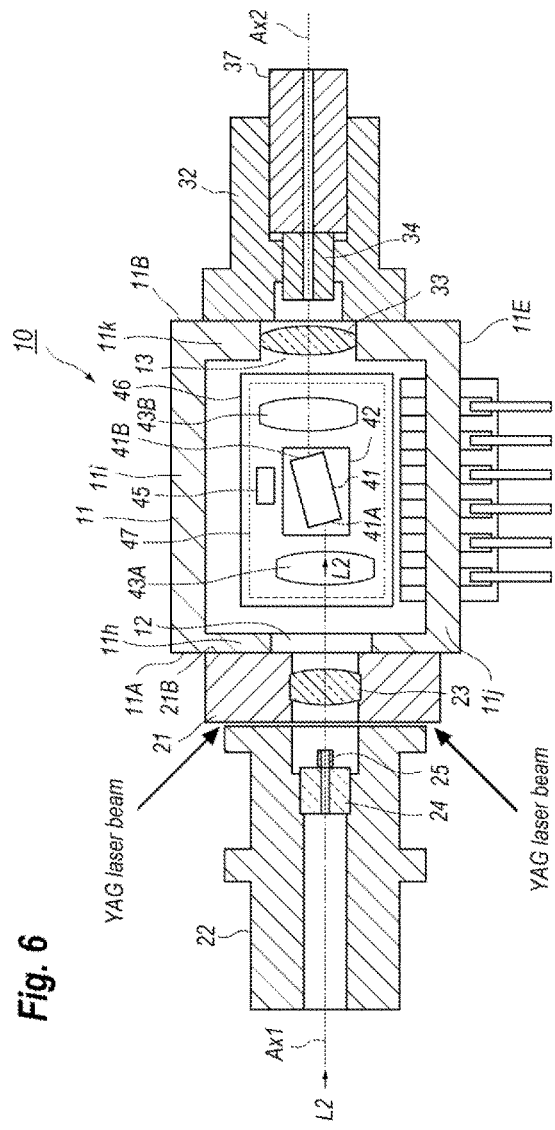
FIG. 6 shows a process to align the front coupling unit with the SOA and fix the front coupling unit to the housing by YAG laser beam.

Then, the process assembles the rear coupling unit 32 with the amplifier unit 10 at step S13, as shown in FIG. 5. Specifically, the SOA 41 is practically activated by providing a bias current thereto and an emission L1, which is a type of the spontaneous emission, is output from the rear facet 41B and collimated by the rear collimating lens 43B. The rear coupling unit 32 is aligned on the rear surface 11B of the housing 10 such that the emission L1 thus provided from the SOA 41 optically couples with the optical fiber 37. That is, as the spontaneous emission of the SOA 41 is detected at the other end of the optical fiber 37 through the stub 34 of the rear coupling unit 32, the rear coupling unit 32 in the front surface 32A, thereof is slid on the rear surface 11B of the housing 11, and the rear coupling unit 32 is fixed to the housing 10 by, for instance, the YAG laser welding in a position at which the detected spontaneous emission of the SOA 41 through the external optical fiber 37 becomes a maximum, or greater than a preset threshold. The YAG laser beams are irradiated concentrically on the corners between the housing 10 and the rear coupling unit 32 to perform the fillet-welding.

Subsequently, the process assembles the front coupling unit 22 with the front lens holder 21 at step S14. Because the front coupling unit 22 implements an optical isolator 25 therein, the spontaneous emission L1 of the SOA 41 may be hard to detect through the front coupling unit 22. Accordingly, the process according to the present embodiment externally provides a test beam L2 to the SOA 41 through the front coupling unit 22. The test beam L2 thus provided may be amplified by the SOA 41 and the amplified beam L1, which may be a spontaneous emission or a stimulated emission of the SOA 41, is collimated by the rear collimating lens 43B, concentrated on the end of the stub 34 by the concentrating lens 33, and detected through the optical fiber 37 coupled with the stub 34. Similar to the aforementioned step S13, the front coupling unit 22 in the rear surface 22B thereof is welded by the YAG laser beam to the front surface 21A of the front lens holder 21 at a position where the amplified test beam L2 detected through the optical fiber 37 becomes a maximum or greater than a preset reference.

Advantages of the process to assemble the optical module 1 according to the present embodiment will be described. The process first fixes the front lens holder 21 to the front surface 11A of the housing 11 by soldering, which enables the front lens holder 21 to be easily fixed to the housing 11 even when the thickness of the front wall 11h is relatively slim. The YAG laser beam sometimes causes open holes for such a slim wall, or results in unreliable welding. A soft fixing such as soldering may fix two metal members without accompanying with any open holes. Moreover, the present embodiment uses the induction heating to melt the soldering, which realizes a uniform melting of the solder and fixing two metal members. The YAG laser welding fixes the front coupling unit 22 with the front lens holder 21, because the front lens holder 21 has a substantial width or thickness to secure the front lens 23. Accordingly, the YAG laser welding causes no open holes in the front lens holder 21, or the front coupling unit 22.

The front coupling unit 22 provides the optical isolator 25 therein, which may effectively suppress or substantially prevent the light from outgoing to the optical coupling unit 22 from the SOA 41. For instance, when the optical module 1 receives light generated from a semiconductor laser diode (LD) provided in a far end of the external optical fiber set in the front coupling unit 22, the LD may be effectively protected from receiving backward light that becomes optical noise sources and drastically degrades the performance of the LD.

When the front coupling unit 21 provides an optical isolator 25, the optical alignment, namely, the active optical alignment, becomes hard because the optical isolator 25 cuts light outgoing from the SOA 41, where the light is to be available for the active optical alignment. The present optical module 1 firstly performs the optical alignment for the rear coupling unit 32 by the spontaneous emission from the SOA 41, then, performs the alignment for the front coupling unit by providing the test beam L2 to the SOA through the front coupling unit 22 and detecting the amplified test beam L2 output through the rear coupling unit 32. Thus, the front and rear coupling units, 22 and 32, may be optically aligned with the SOA 41 by the active alignments even the optical isolator 25 is put in front of the SOA 41.

Second Embodiment

Figure 7:
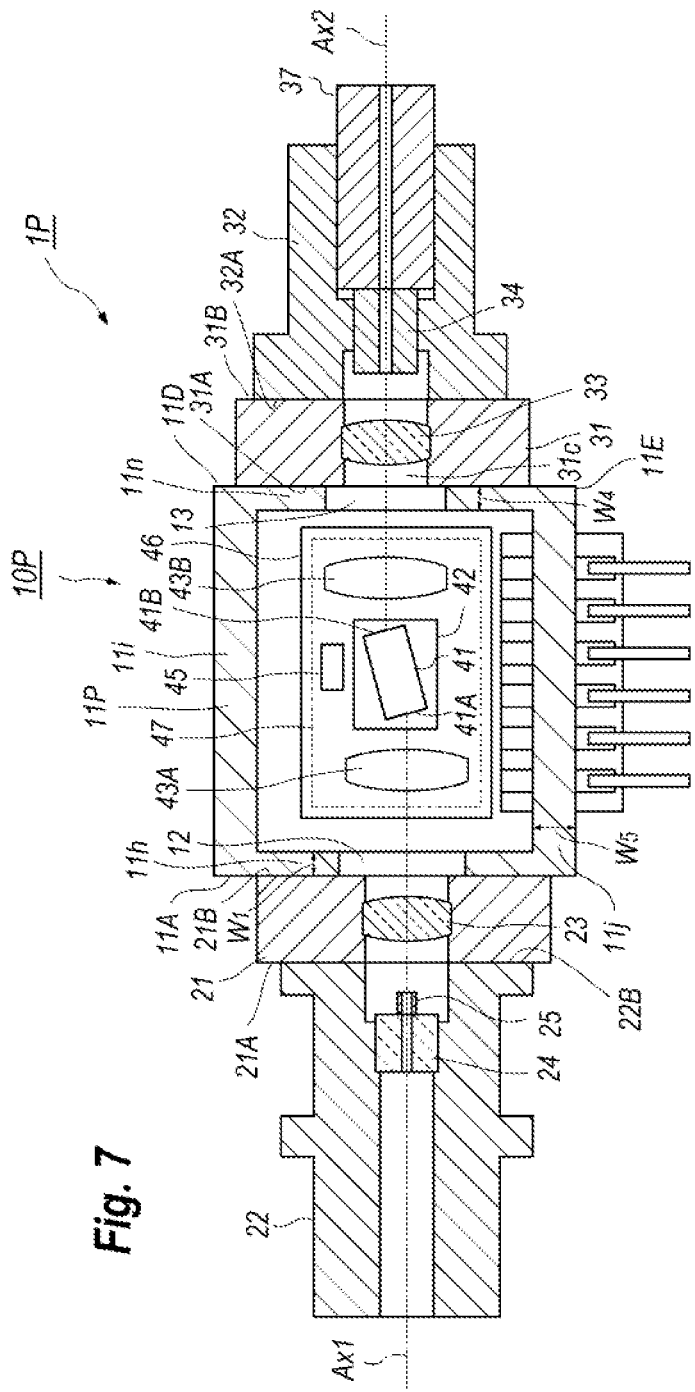
FIG. 7 shows a cross section of an optical module according to the second embodiment of the present application.

FIG. 7 shows a cross section of an optical module 1P according to the second embodiment of the present application. The optical module 1P of the second embodiment has a feature distinguishable from the optical module 1 of the first embodiment that the housing 11P of the amplifier unit 10P has a rear wall 11n, which includes the rear opening 13 and the rear surface 11D, different from the rear wall 11k of the aforementioned embodiment. Other arrangements and configurations of the optical module 1P are the same with, or substantially same with those of the optical module 1 of the first embodiment.

The housing 11P of the amplifier unit 10P of the second embodiment provides the rear wall 11n having a thickness thereof nearly equal to the thickness of the front wall 11h and no lens within the opening 13 thereof. Substituting the thicker rear wall 11k of the first embodiment, the optical module 1P of the second embodiment provides the rear lens holder 31 that secures the lens 33 in a bore 31c thereof. The SOA 41 in the rear facet 41B thereof optically couples with the rear coupling unit 32 through the rear lens holder 31. The rear lens holder 31 provides the front and rear walls, 31A and 31B, where the former surface 31A is fixed to the rear wall 13D of the housing 11P, while, the rear coupling unit 32 in the front surface 32A thereof is fixed to the rear surface 31B of the rear lens holder 31. The rear lens holder 31 may be made of, similar to the front lens holder 21, stainless steel or material having wettability for solder.

Figure 8:
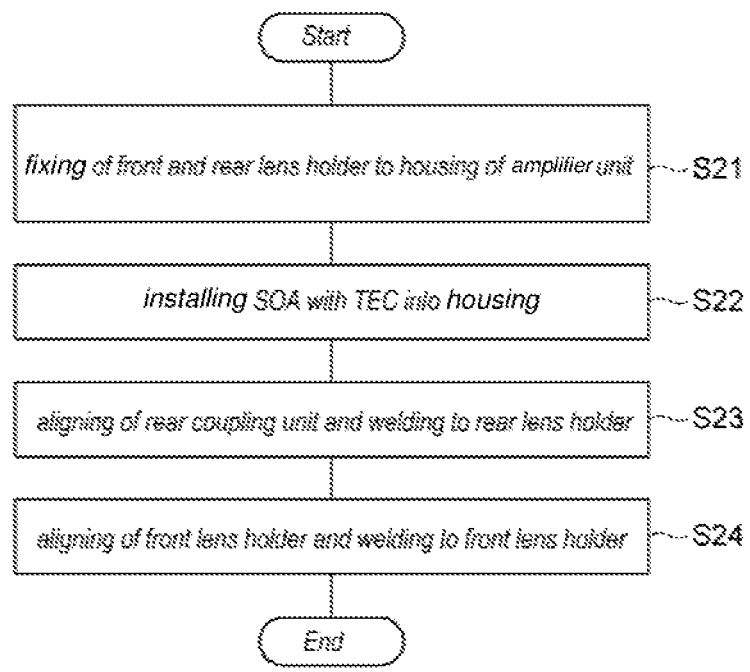
FIG. 8 is a flow chart of a process to assemble the optical module shown in FIG. 7.
Figure 9:
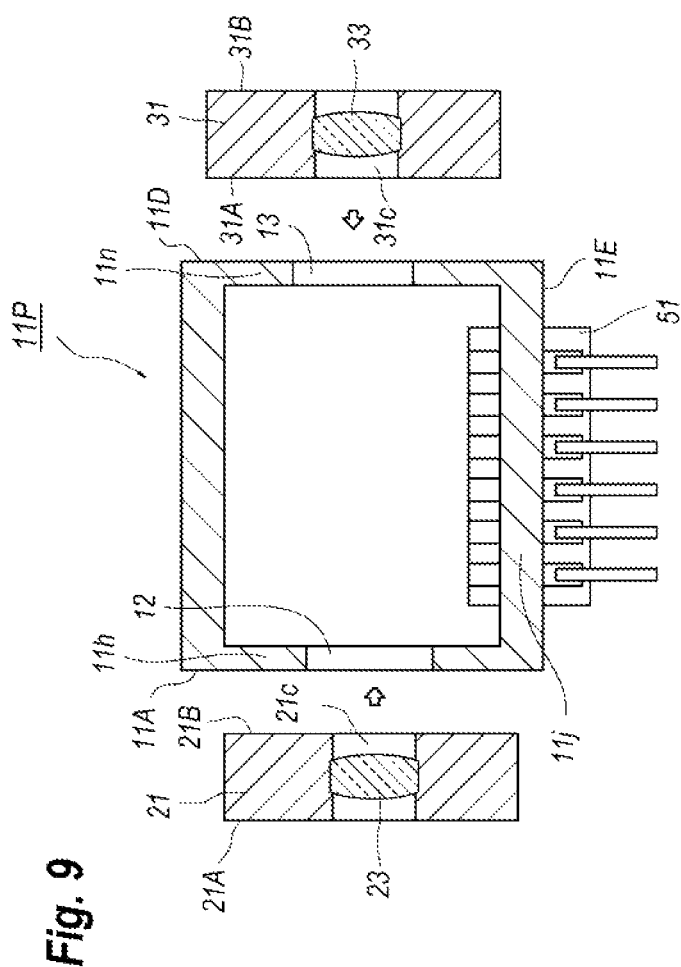
FIG. 9 shows a process to fix the front and rear lens holders to the housing of the amplifier unit by soldering.
Figure 10:
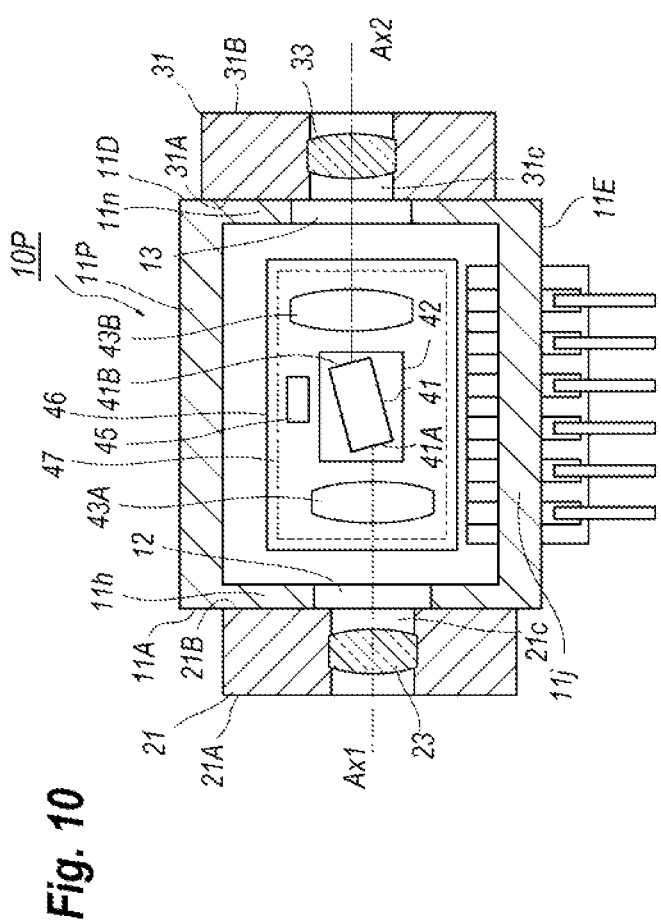
FIG. 10 shows a process to install an intermediate assemble including the SOA within the housing.
Figure 11:
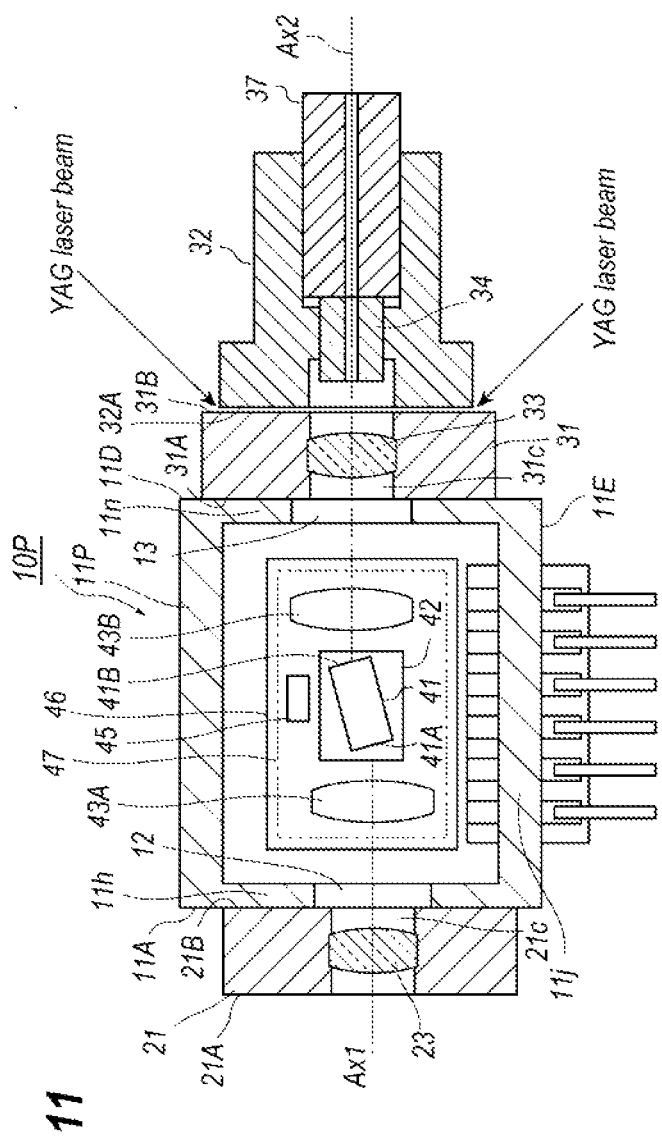
FIG. 11 shows a process to align the rear coupling unit with the SOA and fix the rear coupling unit to the rear lens holder by YAG laser beam.
Figure 12:
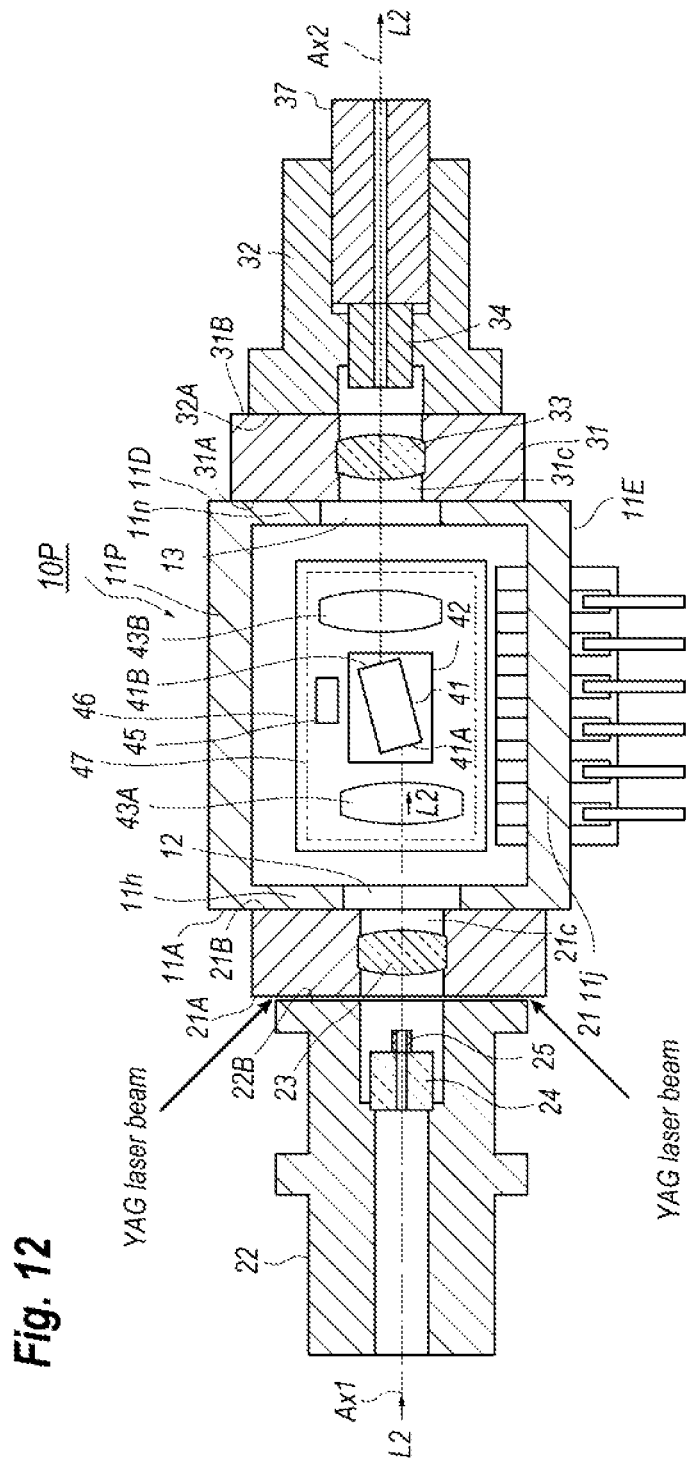
FIG. 12 shows a process to align the front coupling unit with the SOA and fix the front coupling unit to the front lens holder by YAG laser beam.

FIG. 8 is a flow chart of the process to assemble the optical module 1P shown in FIG. 7, and FIGS. 9 to 12 show respective steps S21 to S24 of the process exhibited in FIG. 8.

The process of the second embodiment first assembles the front lens holder 21 with the housing 11P at step S21. That is, after fixing the terminal 51 in the side wall 11j, applying solder on the rear surface 21B of the front lens holder 21 and the front surface 11A of the housing 11P, the front lens holder 21 is fixed to the front surface 11A of the housing 11P by melting the solder on both surfaces, 21B and 11A, then solidifying the solder.

Then, the process installs an assembly that includes the TEC 47 mounting the SOA 41 on the sub-carrier 42, the front and rear collimating lenses, 43A and 43B, and the thermistor 45 through the carrier 46 at step S22. After the installation of the assembly, the electrodes, 52*a* to 52*f*, on the terminal 51 are connected to respective devices, 41, 45, and 47.

Next, the process assembles the rear lens holder 31 and the rear coupling unit 32 with the housing 11P at step S23. The rear lens holder 31 is first fixed to the housing 11P by, for instance, soldering. Specifically, similar to the fixing of the front lens holder 21, first applying solder on the rear surface 11D of the housing 11P and the front surface 31A of the rear lens holder, then melting and solidifying the solder, the housing 11P is fixed to the rear lens holder 31.

Subsequently, the rear coupling unit 32 is fixed to the rear lens holder 31. Similar to the process of the first embodiment, the SOA 41 is practically activated by supplying a bias current to generate a spontaneous emission L1 from the rear facet 41B. The emission L1 is collimated by the rear collimating lens 43B and concentrated by the lens 33 onto the end of the external fiber 37, or an end of the stub 34 secured in the rear coupling unit 32. The rear coupling unit 32 is fixed in a position at which the spontaneous emission L1 detected through the external fiber 37 becomes a maximum or greater than a preset level. The rear coupling unit 32 is welded to the rear lens holder 31 at the position by the YAG laser beam.

Finally, the front coupling unit 22 is assembled with the housing 11P by processes same with those of the first embodiment. Specifically, supplying a test beam L2 to the SOA 41 through an external fiber, which is not shown in FIG. 12, and the front lens 21, and detecting the amplified test beam L2 at the end of the external fiber 37, the front coupling unit 22 is aligned in a position where the detected test beam L2 becomes a maximum. The front coupling unit 22 is welded to the front lens holder 21 at the aligned position.

The optical module 1P of the second embodiment, thus described in the assembling process thereof, provides the amplifier unit 10P whose housing 11P includes the rear wall 11*n* with a thickness of substantially equal to that of the front wall 11*h* to which the front lens holder 21 is fixed. The optical module 1P further provides the rear lens holder 31 to secure the rear concentrating lens 33 in the bore 31*c* thereof, and the rear coupling unit 32 welded to the rear lens holder 31 not the rear wall 11*n* of the housing 11P. The front wall 11*h* and the rear wall 11*n* have the thicknesses, $W_1$ and $W_4$, of 0.3 mm, and the side wall 11*j* has the thickness of 0.8 mm. The front and rear walls, 11*h* and 11*n*, preferably have respective thicknesses of 0.1 to 0.3 mm, while, the side wall 11*j* preferably has a thickness greater than 0.8 mm. Accordingly, even the housing 11P of the amplifier unit 10P provides a slim rear wall 11*n*, which is unable to secure the rear concentrating lens therein and to fix the rear coupling unit 32 by welding, the rear coupling unit 32 is fixed by welding through the rear lens holder 31.

Also, even when the optical module 1P installing the SOA 41 therein is necessary to align optical units in both of front and rear of the SOA 41, and one of the optical units installs an optical isolator therein, which is unable to extract the test beam for the optical alignment out of the optical module, the active alignment of the front coupling unit 22 becomes possible by operating the SOA 41 in the amplifying mode.

Third Embodiment

Figure 13:
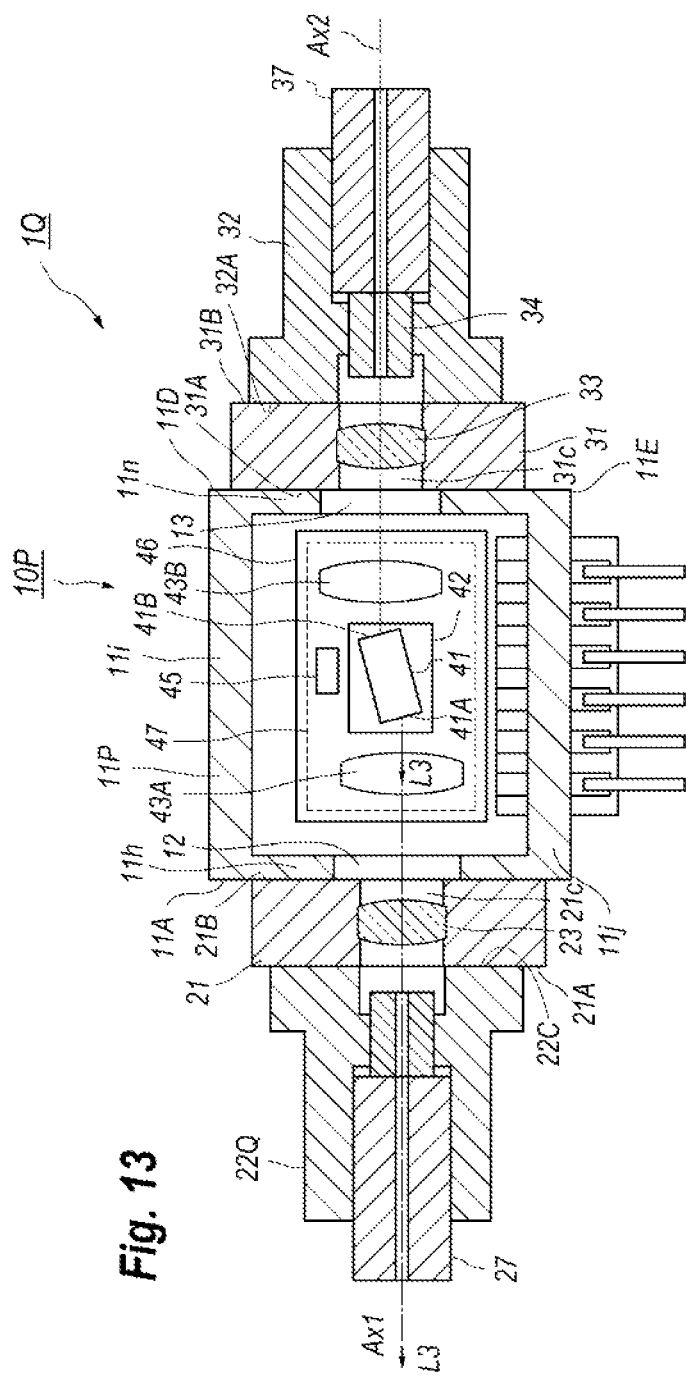
FIG. 13 shows a cross section of an optical module according to the third embodiment of the present application.

FIG. 13 shows a cross section of an optical module 1Q according to still another embodiment of the present application. The optical module 1Q of the third embodiment has a feature distinguishable from those of the aforementioned embodiments in a point where the front coupling unit 22Q provides an optical fiber 27 therein. Other arrangements or configurations of the optical module 1Q are same with or substantially same with those of the optical modules, 1 and 1P, of the aforementioned embodiments.

Because the front coupling unit 22Q of the present embodiment provides no optical isolator; the process may perform the active alignment for the front coupling unit 22Q by the spontaneous emission caused in the SOA 41. Specifically, the SOA 41 causes an emission by being supplied with a bias current. The emission L3 is able to be extracted through the front lens 23 and the optical fiber 27 in the front coupling unit 22Q. The front coupling unit 22Q is fixed to the front lens holder 21 by the YAG laser welding at a position where the emission L3 detected through the optical fiber 27 becomes a maximum, which is similar to the alignment and the fixing of the rear coupling unit 32 with respect to the rear lens holder 31.

Thus, the process of the present embodiment performs the active alignment for the front and rear coupling units, 22Q and 32, by using the spontaneous emissions, L3 and L1, from the SOA 41, which simplifies the process to assemble the optical module.

Fourth Embodiment

Figure 14:
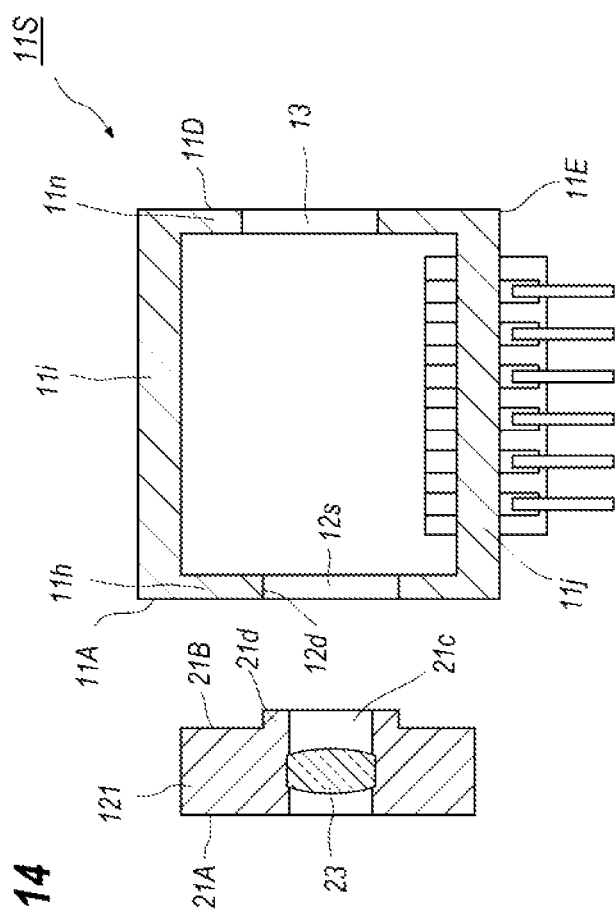
FIG. 14 shows a process to fix the front lens holder to the housing according to the fourth embodiment of the present application.
Figure 15:
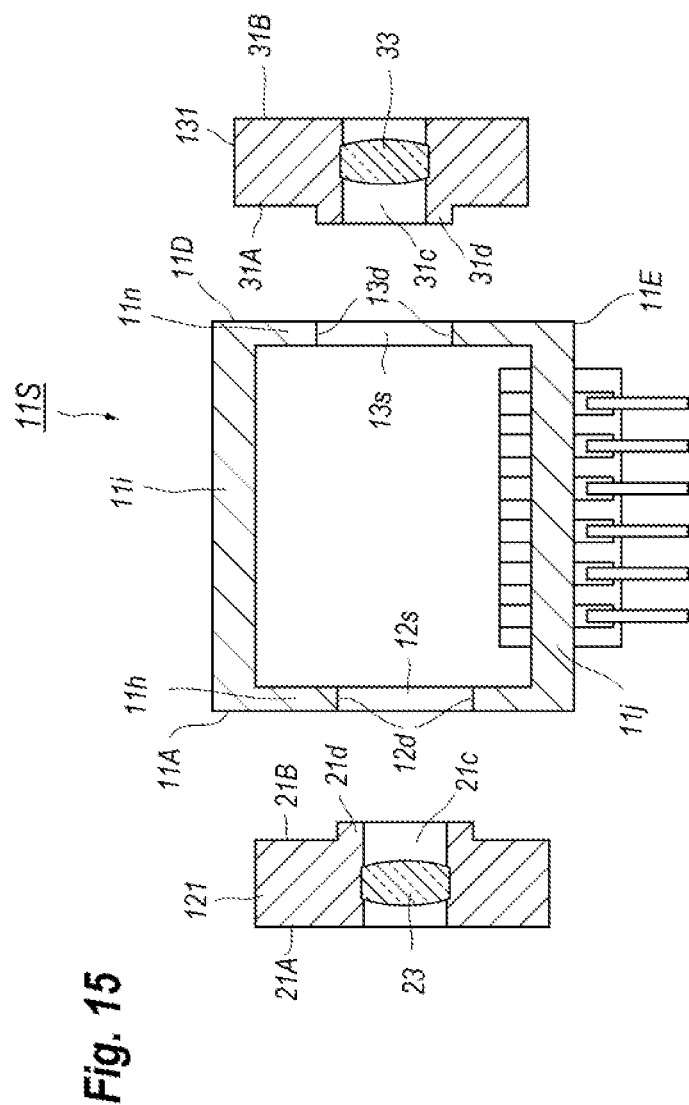
FIG. 15 shows a process to fix the front and rear lens holders to the housing according to the fourth embodiment of the present application.
Figure 16:
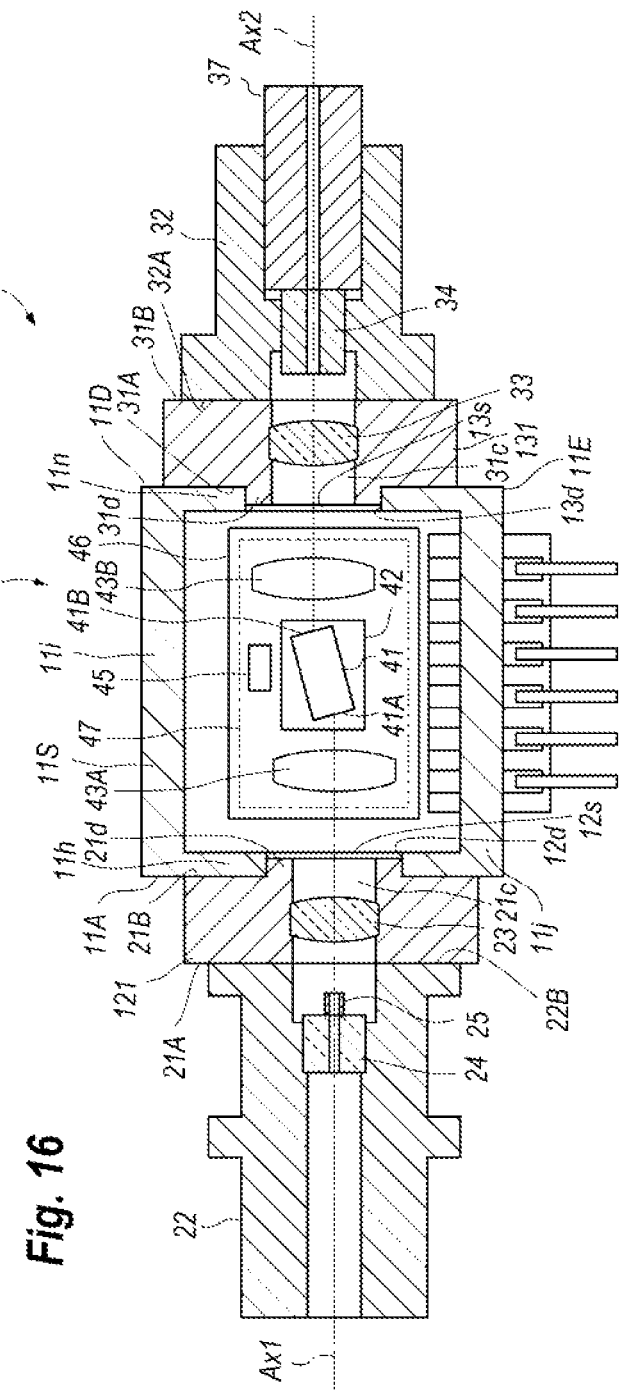
FIG. 16 shows a cross section of an optical module according to the fourth embodiment of the present application.

FIGS. 14 to 16 show cross sections of an optical module 1S still another embodiment of the present application. The optical module 1S of the present embodiment has a feature distinguishable from aforementioned embodiments in a point where the front and rear lens holders, 121 and 131, provide flanges, 21*d* and 31*d* around the bore 21*c* and 31*c* thereof fit within respective openings, 12*s* and 13*s*, of the housing 11S. The outer dimensions or diameter of the flanges, 21*d* and 31*d*, are slightly smaller than diameters of edges, 12*d* and 13*d*, of the openings, 12*s* and 13*s*. Accordingly, fitting the flanges, 21*d* and 31*d*, into respective openings, 12*s* and 13*s*, the positions of the lens holders, 21 and 31, against the housing 11S may be automatically determined.

This means that, the lens holders, 121 and 131, secures respective concentrating lenses, 23 and 33, in a center of the bores, 21*c* and 31*c*. The fitting of the flange 21*d* and 31*d* into the openings, 12*s* and 13*s*, the center of the lenses, 23 and 33, may be determined. The lens holders, 121 and 131, may be fixed to the housing 11S by soldering. Specifically, applying the solder on the rear surface 21B of the lens holder 121 in a portion around the flange 21*d* but not on the side and the top of the flange 21*d*, also applying solder on the front surface 11A of the housing 11S but not on the edge 12*d* of the opening 12*s*, fitting the lens holder 121 into the opening 12*s*, and melting the solder by, for instance, the induction heating and solidifying the solder, the lens holder 121 is assembled with the housing 11S. The process to fix the front lens holder 121 to the housing 11S is shown in FIG. 14.

FIG. 15 shows a process to assemble the front and rear lens holders, 121 and 131, to the housing 11S. As shown in FIG. 15, the optical module 1S may provide not only the front lens holder 121 but the rear lens holders 131 each having the flanges, 21*d* and 31*d*, fitting in the front and rear openings, 12*s* and 13*s*, of the housing 11S. Because both the front and rear lens holders, 121 and 131, provide the flanges, 21*d* and 31*d*, the alignment of the lenses, 23 and 33, with respect to the housing 11S. That is, inserting the flanges, 21*d* and 31*d*, into the openings, 12*s* and 13*s*, the lenses, 23 and 33, may be roughly aligned in respective centers of the openings, 12*s* and 13*s*, of the housing 11S.

FIG. 16 shows a cross section of the optical module 1S according to the fourth embodiment of the present application. The optical module 1S provides the front and rear lens holders, 121 and 131, thus described based on FIGS. 14 and 16. Arrangements or configurations except for the front and rear lens holders, 121 and 131, are same with those of aforementioned embodiments. Each of the front and rear lens holders, 121 and 131, are fit into respective openings, 12s and 13s, of the housing 11S, which automatically aligns the center of the lenses, 23 and 33, against the housing 11S. The process to assemble the optical modules installs the assembly including the SOA 41 and the front and rear collimating lenses, 43A and 43B, into the housing after the fixing of the lens holder as aligning the SOA 41 with respect to the front and rear concentrating lenses, 23 and 33. When the optical axis of the lenses, 23 and 33, that is, the lenses, 23 and 33, in the optical axes thereof are considerably offset from the designed axes, the front and rear coupling units, 22 and 32, become unable to couple with the SOA 41, or to extract the light by substantial magnitude. The arrangement of the lens holder, 121 and 131, having the flange, 21d and 31d, may align the lens, 23 and 33, with the opening, 12s and 13s, and accelerates the alignment of the SOA 41 with respect to the housing.

Fifth Embodiment

Figure 17:
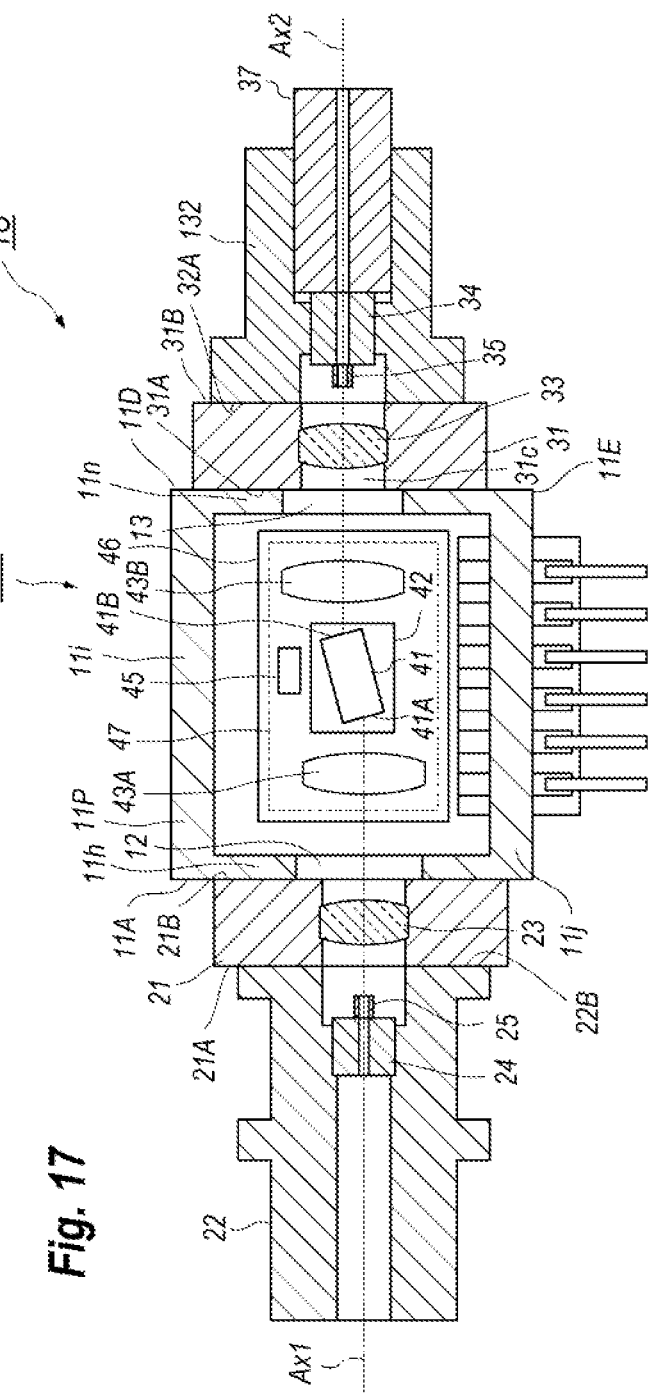
FIG. 17 shows a cross section of an optical module according to the fifth embodiment of the present application.

FIG. 17 shows a cross section of an optical module 1U according to still another embodiment of the present application. The optical module 1U has a feature distinguishable from those of the aforementioned embodiments in that, not only the front coupling unit 22, but the rear coupling unit 132 provides an optical isolator 35. Other arrangements except for the rear optical isolator 35 are substantially same with those of the aforementioned embodiments.

The optical isolator 35 may pass light coming from the SOA 41 but substantially cut light going to the SOA 41. Accordingly, the rear optical isolator 35 causes no effect for the active alignment of the rear coupling unit 132 with the SOA 41 and that of the front coupling unit 22 with the SOA 41. That is, the active alignment of the rear coupling unit 132 may utilize the spontaneous emission L1 of the SOA 41, and the active alignment of the front coupling unit 22 may utilize the test beam provided externally to the front coupling unit 22 and the amplified test beam provided from the SOA 41 through two lenses, 43B and 33, and the optical fiber 37. The rear coupling unit 132 and the front coupling unit 22 are fixed to the respective position with respect to the housing 11P of the amplifier unit 10P where the spontaneous emission L1 and the amplified test beam L2 in the magnitudes thereof become respective maxima.

Sixth Embodiment

Figure 18:
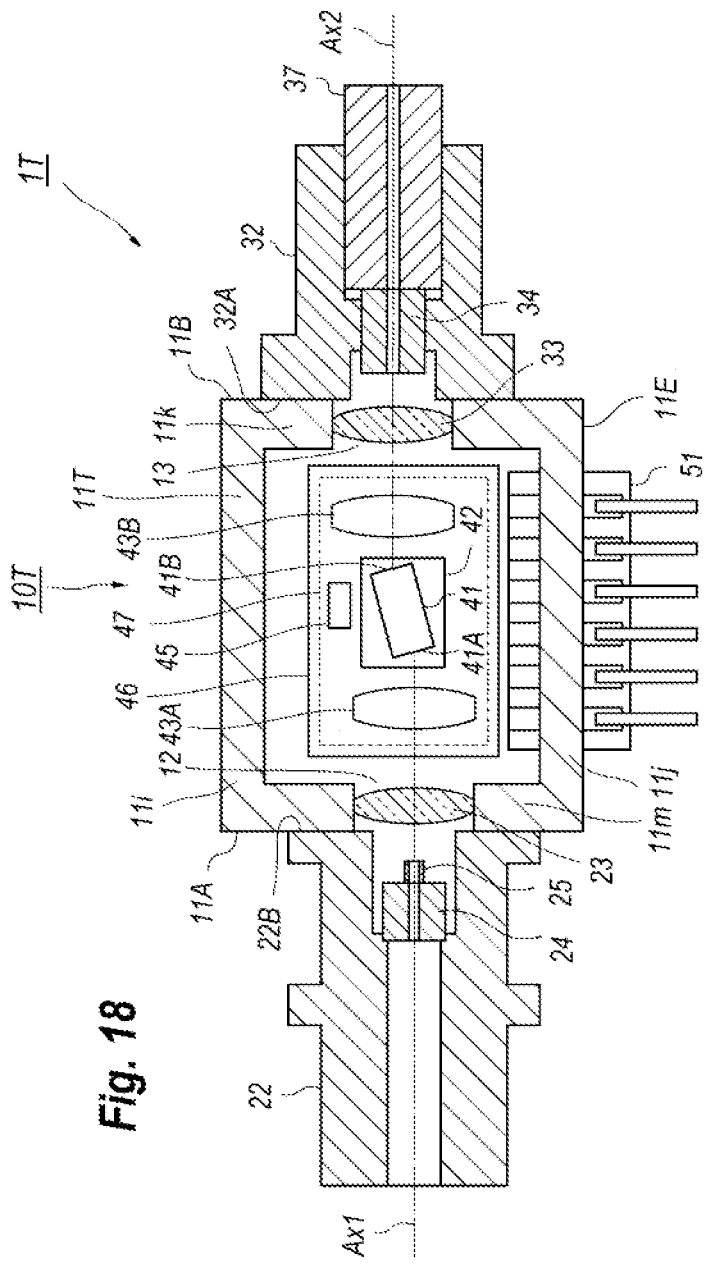
FIG. 18 shows a cross section of an optical module according to the sixth embodiment of the present application.

FIG. 18 shows a cross section of an optical module 1T according to the sixth embodiment of the present application. The optical module 1T shown in FIG. 18 has a feature distinguishable from those of aforementioned embodiments in that the housing 11T optical amplifier unit 10T provides a thick front wall 11m and omits the front lens holder 21 to secure the front lens 23. Instead, the thick front wall 11m holds the front lens 23 same as those of the rear wall 11k. Other arrangements of the optical module 1T except for the front wall 11m and no front lens holder 21 are same with those of the optical module 1 of the first embodiment shown in FIG. 1.

The process to assemble the optical module 1T fundamentally same with the process for the optical module 1 of the first embodiment except for that the assembly installed within the housing 11T of the amplifier unit 10T is set after building the terminal 51 in the side wall 11j but before assembling of the rear coupling unit 32 with the housing 11T. That is, the optical module 1T may omit the step to solder the front lens holder 21 to the front surface 11A of the housing 11T. The rear coupling unit 32 is aligned and fixed by the YAG laser welding to the housing 11T at the position where the spontaneous emission of the SOA 41 in the magnitude thereof becomes a maximum as detecting the emission output from the rear facet 41B trough two lenses, 43B and 33, and the optical fiber.

Also, in the process for the optical module 1T, the front coupling unit 22 is aligned with the SOA 41 on the front surface 11A of the housing 11T not the front surface 21A of the front lens holder 21, and directly welded to the frond surface 11A of the housing 11T by the YAG laser beam. Specifically, providing the test beam L2 to the SOA through the optical fiber set within the front coupling unit 22 and two lenses, 23 and 43A, amplifying the test beam L2 by the SOA 41, and detecting the amplified test beam L2 output from the rear facet 41B of the SOA 41 through two lenses, 43B and 33, and the other optical fiber, the front coupling unit 22 is fixed at the position where the thus detected test beam L2 becomes a maximum.

Thus, the process to assemble the optical module 1T may show advantages same with those of the aforementioned embodiment. That is, the rear coupling unit 32 is actively aligned as using the spontaneous emission coming from the SOA 41, and the front coupling unit 22 is also actively aligned as using the test beam external provided to the optical module 1T and amplified by the SOA 41 internally installed within the amplifier unit 10T.

In the foregoing detailed description, the process and module according to the present invention have been described with reference to specific exemplary embodiments thereof. It will, however, be evident that further modifications and changes may be made thereto without departing from the broader spirit and scope of the present invention. The present specification and figures are accordingly to be regarded as illustrative rather than restrictive.

I claim:

1. An optical module, comprising:
    an amplifier unit including a housing that encloses a semiconductor optical amplifier (SOA) therein, the housing having a front wall and a side wall;
    a lens holder that secures a lens optically coupled with the SOA, the lens holder being soldered to the front wall of the housing; and
    a coupling unit that receives an optical fiber therein, the coupling unit being welded to the lens holder,
    wherein the front wall has a thickness smaller than a thickness of the side wall.

2. The optical module of claim 1,
    wherein the housing further includes a rear wall opposite to the front wall, the rear wall having a thickness smaller than a thickness of the side wall,
    wherein the optical module further includes another lens holder soldered to the rear wall.

3. The optical module of claim 2,
    wherein the another lens holder secures another lens therein.

4. The optical module of claim 1,
wherein the coupling unit includes an optical isolator that passes light going to the SOA but cuts another light coming from the SOA.

5. The optical module of claim 1,
wherein the front wall has a thickness less than a half of a thickness of the side wall.

* * * * *